United States Patent [19]

Aiko et al.

[11] Patent Number: 4,554,670

[45] Date of Patent: Nov. 19, 1985

[54] SYSTEM AND METHOD FOR ADPCM TRANSMISSION OF SPEECH OR LIKE SIGNALS

[75] Inventors: Shinichi Aiko; Rikio Maruta; Takao Nishitani, all of Tokyo, Japan

[73] Assignee: NEC Corporation, Tokyo, Japan

[21] Appl. No.: 484,676

[22] Filed: Apr. 13, 1983

[30] Foreign Application Priority Data

Apr. 14, 1982 [JP] Japan ................................. 57-63032
Apr. 14, 1982 [JP] Japan ................................. 57-63033
Apr. 14, 1982 [JP] Japan ................................. 57-63034

[51] Int. Cl.$^4$ ............................................ H03K 13/22
[52] U.S. Cl. .................................. 375/30; 332/11 D; 358/135
[58] Field of Search ............................ 375/27, 30, 33; 332/11 D; 358/133, 135; 381/29, 30

[56] References Cited

U.S. PATENT DOCUMENTS

| | | | |
|---|---|---|---|
| 3,973,199 | 8/1976 | Widmer | 375/30 |
| 4,179,710 | 12/1979 | Ishiguro et al. | 375/27 |
| 4,200,886 | 4/1980 | Musmann et al. | 358/135 |
| 4,292,651 | 9/1981 | Kretz et al. | 358/135 |
| 4,385,393 | 5/1983 | Chaure et al. | 375/30 |
| 4,430,670 | 2/1984 | Netravali | 358/135 |

OTHER PUBLICATIONS

Cohn et al., "The Residual Encoder-An improved ADPCM System for Speech Digitization", IEEE on Communication Com 23, No. 9, Sep. 1976.

Cummiskey, "Adaptive Quantization in Differentail PCM Coding or Speech", The Bell System Technical Journal, vol. 32, No. 7, Sep. 1973.

Primary Examiner—Robert L. Griffin
Assistant Examiner—Stephen Chin
Attorney, Agent, or Firm—Sughrue, Mion, Zinn, Macpeak and Seas

[57] ABSTRACT

An adaptive differential pulse code modulated (ADPCM) transmission system includes a subtractor for providing a difference signal $E_j$ between an input signal $X_j$ and a predicted signal $\bar{X}_j$. A coder encodes the difference signal $E_j$ into a coded signal $U_j$ for transmission to a receiver. The signal $U_j$ is also decoded at the transmitter to produce a reproduced error signal $\hat{E}_j$. A prediction circuit operates to generate a prediction signal $\bar{X}_j$ on the basis of the reproduced error signal $\hat{E}_j$. The prediction circuit is controlled by a control circuit which operates to detect transmitter instability. A first level detector in the control circuit compares the input signal level against the level of a transmitter produced signal representing the input signal. A second level detector of the control circuit determines when the input signal is below a specified value. Transmitter instability is judged by a decision circuit which determines when the output of the first level detector exceeds a preset value and the output of the second level detector is below another preset value.

14 Claims, 8 Drawing Figures

SYSTEM AND METHOD FOR ADPCM TRANSMISSION OF SPEECH OR LIKE SIGNALS

BACKGROUND OF THE INVENTION

The present invention relates to a system and method for differential pulse code modulation (DPCM) transmission, and more particularly to a system and method for adaptive DPCM (ADPCM) transmission to achieve band compression of speech or like signals.

For speech or like signals which are closely correlated to one another, the amplitude of a sample can be predicted on the basis of previous samples. A DPCM system achieves band compression by utilizing this feature of speech or like signals. The DPCM system is equipped with a predictor whose prediction coefficients are determined by the average speech spectrum. However, since actual speech signals vary with time, the optimum values of the coefficients also vary with time. As a result, the DPCM system having fixed prediction coefficients cannot be very precise. For the purpose of obviating this disadvantage of the DPCM system, there has been developed an ADPCM system in which prediction coefficients are adaptively corrected in accordance with speech signals varying with time. For details of the ADPCM system, reference is made to U.S. Pat. No. 4,317,208 and to a paper by David L. Cohn et al., entitled "The Residual Encoder—An Improved ADPCM System for Speech Digitalization", IEEE Transactions on Communications, Vol. COM-23, No. 9, pp. 935–941.

However, because the prediction coefficients are constantly corrected in the ADPCM system, there arises the problem of predictor stability, which problem does not occur when the prediction coefficients are fixed. Thus, if the coefficients of the adaptive predictor happens to be corrected to such a value as causes the oscillation of the predictor, the oscillation results in a predicted value which is unrelated to the input signal and thereby prevents precise prediction.

SUMMARY OF THE INVENTION

An object of the present invention, therefore, is to provide an ADPCM transmission system and method whose predictor does not oscillate.

According to the invention, there is provided an ADPCM transmission system comprising:

a transmitter having coding means including a subtractor for providing a difference $E_j$ between an input signal $X_j$ and a predicted signal $\tilde{X}_j$, a coder for coding the difference $\hat{E}_j$ given from the subtractor into a coded signal $U_j$, a first decoder for obtaining a first reproduced error signal $\hat{E}_j$ by decoding the coded signal $U_j$ given from the coder, and first prediction means for generating the first predicted signal $\tilde{X}_j$ on the basis of the first reproduced error signal $\hat{E}_j$ from the first decoder; and first control means for controlling the first prediction means in response to the input signal and a difference between an internal signal used in the coding means and the input signal; and a receiver having decoding means including a second decoder for receiving the code $U_j$ supplied from the transmitter and decoding the received code $U_j$ into a second reproduced error signal $\hat{e}_j$, second prediction means for producing a second predicted signal $\tilde{x}_j$ on the basis of the second reproduced error signal $\hat{e}_j$ from the second decoder, means for producing a decoded signal $\hat{x}_j$ in response to the second reproduced error signal $\hat{e}_j$ and the predicted signal $\tilde{x}_j$; and second control means for controlling the decoded signal $\hat{x}_j$ in response to an internal signal used in the second decoding means.

Further, an ADPCM transmission method according to the present invention comprises:

a transmitting method having coding steps including a step for providing a difference $\bar{E}_j$ between an input signal $X_j$ and a first predicted signal $\tilde{X}_j$, a step for coding the difference $E_j$ into a coded signal $U_j$, a step for decoding the coded signal $U_j$ into a first reproduced error signal $\hat{E}_j$, and a step for producing the first predicted signal $\tilde{X}_j$ on the basis of the first reproduced error signal $\hat{E}_j$; and first control steps including a step for producing a first control signal from the input signal and a difference between an internal signal used in the coding steps and the input signal, and a step for controlling the first predicted signal $\tilde{X}_j$ according to the first control signal; and a receiving method having decoding steps including a step for receiving the code $U_j$ transmitted and decoding the code $U_j$ into a second reproduced error signal $\hat{e}_j$, a step for producing a second predicted signal $\tilde{x}_j$ on the basis of the second reproduced error signal $\hat{e}_j$, and a step for producing a decoded signal $\hat{x}_j$ from the second predicted signal $\tilde{x}_j$ and the second reproduced error signal $\hat{e}_j$; and second control steps including a step for producing a second control signal in response to an internal signal used in the decoding steps, and a step for controlling the the decoded signal $\hat{x}_j$ according to the second control signal.

BRIEF DESCRIPTION OF THE DRAWINGS

Other features and advantages of the invention will be more apparent from the detailed description hereunder taken in conjunction with the accompanying drawings, wherein.

In the figures, the same reference numerals designate respectively the same structural elements.

DETAILED DESCRIPTION OF THE PREFERRED EMBODIMENTS

Figure 1:
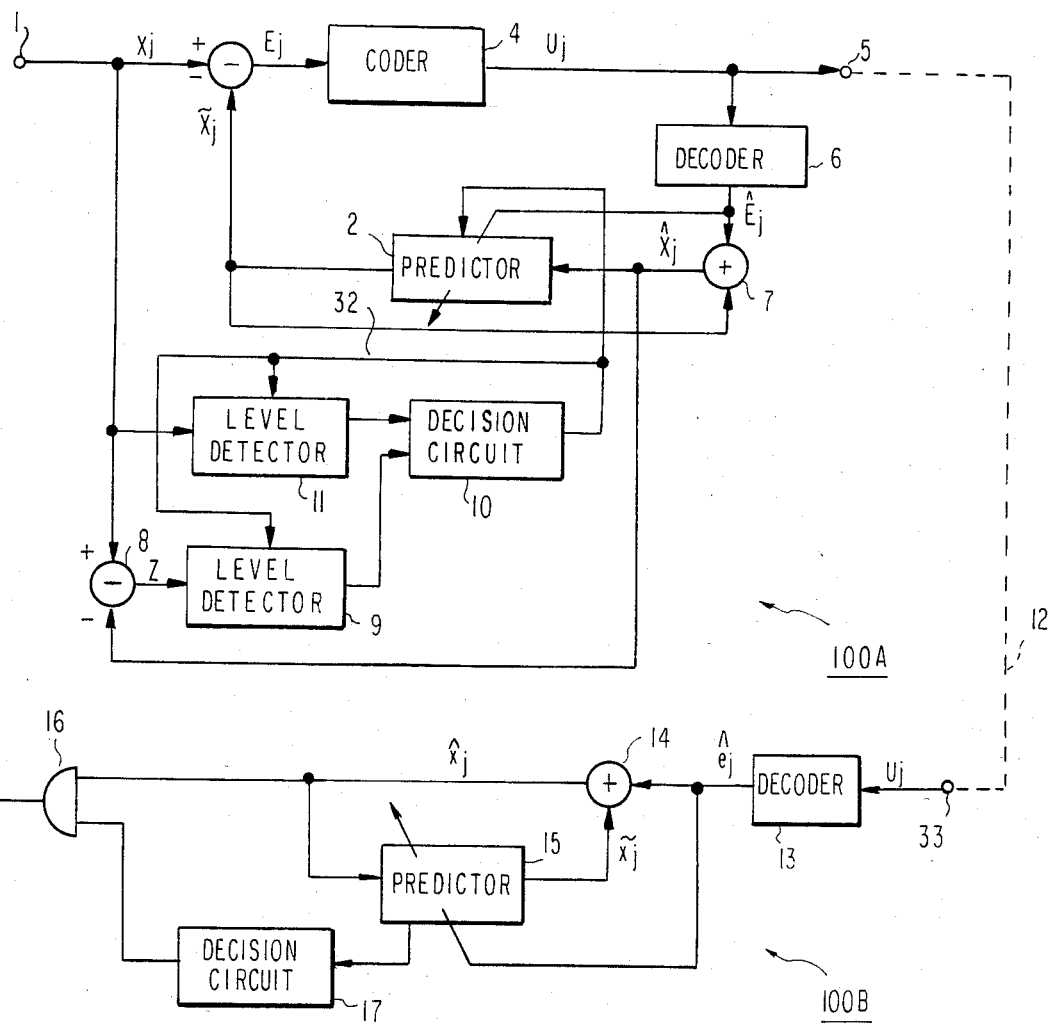
FIG. 1 is a block diagram illustrating a transmitter and receiver according to a first preferred embodiment of the invention.

Referring to FIG. 1, an ADPCM system of the first embodiment of the invention has a transmitter 100A and a receiver 100B. A subtractor 3 provides a difference (a prediction error signal) $E_j$ between a digital signal $X_j$ fed to an input terminal 1 at a time point j and a predicted signal $\tilde{X}_j$ supplied from a predictor 2, and provides a coder 4 with the prediction error signal $E_j$. The coder 4 encodes the prediction error signal $E_j$ into a code $U_j$ to be fed to a decoder 6 and an output terminal 5. The decoder 6 decodes the code $U_j$ into a reproduced error signal $\hat{E}_j$. Since the reproduced error signal $\hat{E}_j$ contains quantization noise produced in the coder 4, it generally is not identical with the prediction error signal $E_j$. An adder 7 produces a locally decoded signal $\hat{X}_j$ by adding the reproduced error signal $\hat{E}_j$ and the predicted signal $\tilde{X}_j$. The predictor 2, which produces the predicted signal $\tilde{X}_j$ on the basis of the locally decoded signal $\hat{X}_j$, consists of an adaptive filter whose filter coefficients are changed adaptively on the basis of the reproduced error signal $\hat{E}_j$ and the locally decoded signal $\hat{X}_j$. Typical correction algorithms for the filter coefficients are represented by the following equations:

$$A_i^{j+1} = A_i^j + g \cdot \hat{E}_j \cdot \hat{X}_{j-i} / \sum_{i=1}^{n} (X_{j-i})^2 \quad (1)$$

$$A_i^{j+1} = A_i^j + g \cdot \hat{E}_j \cdot \text{Sign}(\hat{X}_{j-i}) / \sum_{i=1}^{n} |X_{j-i}| \quad (2)$$

where $A_i^j$ is the i-th filter coefficient of the filter at the time point j, g is a correction gain, and the value of sign($\hat{X}_j$) is $+1$ when $\hat{X}_j$ is positive, or $-1$ when $\hat{X}_j$ is negative.

The following equation may as well be used as a simplified correction algorithm:

$$A_i^{j+1} = A_i^j + g' \cdot (\hat{e}_j / \Delta) \cdot \text{Sign}(\hat{X}_{j-i}) \quad (3)$$

where $\Delta$ is a normalization factor close to the effective value of the prediction error signal. The algorithms represented by the equations (1), (2) and (3) all give the new filter coefficient at a time point $j+1$ by adding the correction value (second term of the right side) to the filter coefficient $A_i^j$ at the time point j. A subtractor 8 provides a difference Z between the input signal $X_j$ and the locally decoded signal $X_j$ and supplies the difference Z to a level detector 9. The detector 9 detects the level of the output signal of the subtractor 8 and feeds it to a decision circuit 10. When the adaptive coding is normally accomplished, the input signal $X_j$ and the local decoded signal $\hat{X}_j$ have values very close to each other, so that, if the decision circuit 10 finds that the difference signal Z is larger than a prescribed level, the transmitter 100A can be judged to have become unstable. However, if the dynamic range of the input signal $X_j$ is wide, the level of the difference signal Z becomes large with a rise in the level or frequency of the input signal $X_j$. As a result, it is impossible to correctly determine the instability of the transmitter 100A according to the level of the difference signal Z alone. For this reason, the present invention ensures more accurate determination of the instability of the transmitter 100A by providing another level detector circuit 11 which detects the level of the input signal $X_j$. The decision circuit 10 determines the transmitter 100A to be unstable only when the difference signal Z exceeds the predetermined level and the level of the input signal $X_j$ is lower than a certain value. When instability is detected, the decision circuit 10 generates a control signal 32 which resets the filter coefficients of the adaptive filter 2 to a predetermined value and also resets the level detectors 9 and 11.

The receiver 100B has a decoder 13 which has the same structure as the decoder 6 of the transmitter 100A. The decoder 13 decodes a code $U_j$, which is supplied to a terminal 33 by way of a transmission line 12, into a reproduced error signal $\hat{e}_j$, which is given to an adder 14. The adder 14 obtains a decoded signal $\hat{x}_j$ by adding the reproduced error signal $\hat{e}_j$ and a predicted signal $\tilde{x}_j$ fed from a predictor 15. The decoded signal $\hat{x}_j$ is supplied to the predictor 15 as well as to an AND gate 16. Further details of the predictor 15 are dispensed with here, because it is the same as the predictor 2 of the transmitter 100A. The receiver 100B further comprises a decision circuit 17 consisting of a comparator for comparing a prescribed value with a coefficient at a predetermined tap of the predictor 15, and the AND gate 16 for preventing the decoded signal $\hat{x}_j$ from appearing at an output terminal 34 in response to the output of the decision circuit 17. The decision circuit 17 and the AND gate 16 are used for protecting the receiver 100B from producing an abnormal signal due to an incident such as an instantaneous cut-off of the transmission line 12. Thus, if the code $U_j$ keeps the same value, for example "0" owing to the instantaneous cut-off of the transmission line 12, the correction of the prediction coefficients will also keep substantially the same value at every point of time. As a result, the prediction coefficient will assume a clearly incorrect value which will cause the receiver to produce an abnormal sound. The decision circuit 17 and gate 16 are provided to prevent this abnormal sound.

Figure 2:
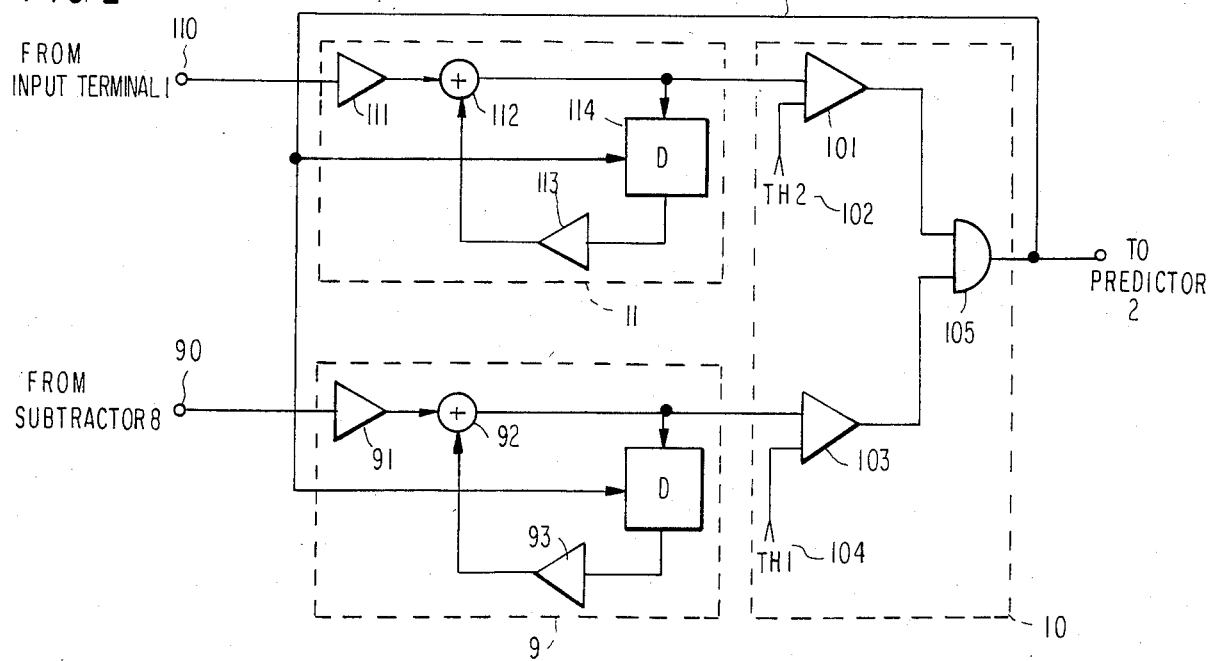
FIG. 2 is a circuit diagram of a preferred embodiment of the level detector and the decision circuit of the transmitter of the first embodiment of the invention illustrated in FIG. 1.

FIG. 2 shows specific circuitry for the level detectors 9 and 11 and the decision circuit 10. Referring to FIG. 2, since the level detectors 9 and 11 are each comprised of an integrator having the same structure, only the detector 9 will be described below. The level detector 9 has a multiplier 91 which multiplies the output signal of the subtractor 8 fed from the terminal 90 by a coefficient smaller than 1. The output of the multiplier 91 is added in an adder 92 to a signal delayed by one sample, fed from another multiplier 93. The output of the adder 92 is supplied to the decision circuit 10 and a delay circuit 94, which delays the output of an adder 92 by one sample before feeding it to a multiplier 93. The multiplier multiplies the output of the delay circuit 94 by an integrating coefficient. The decision circuit 10 has a first comparator 101 for comparing the output of the level detector 11 with a threshold level TH2, and a second comparator 103 for comparing the output of the level detector 9 with a threshold level TH1. An AND gate 105 takes the logical product of the outputs of the comparators 101 and 103, and produces the control signal for resetting the delay circuits 94 and 114, and the predictor 2.

Figure 3:
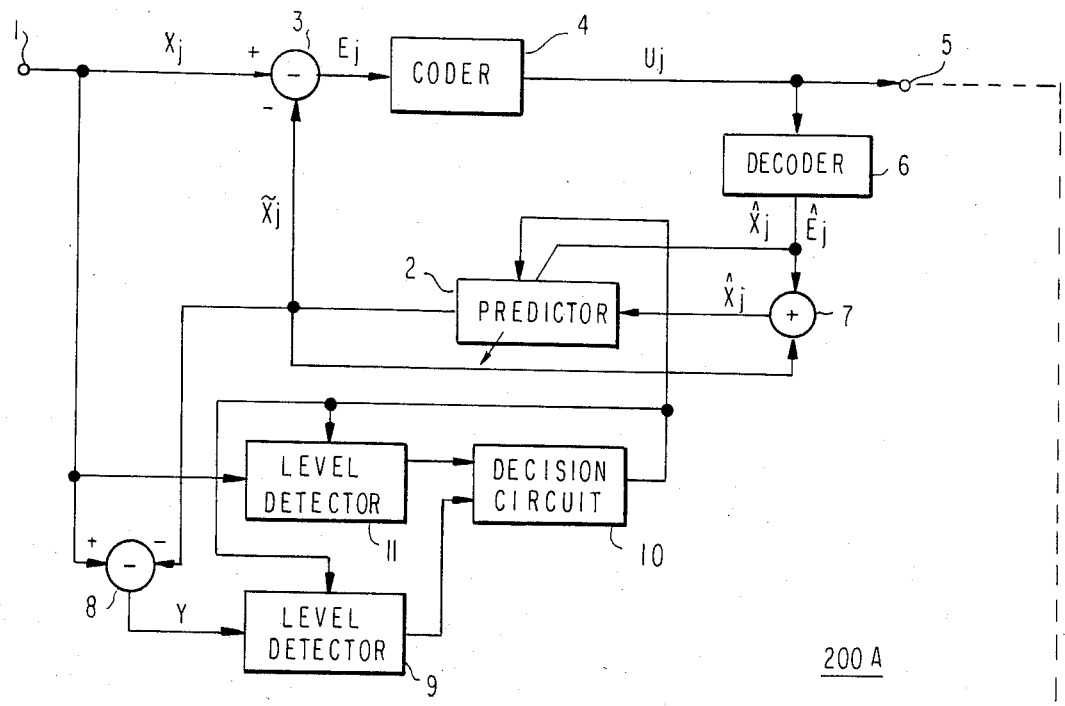
FIG. 3 is a block diagram of a transmitter and receiver according to a second embodiment of the invention.
Figure 3:
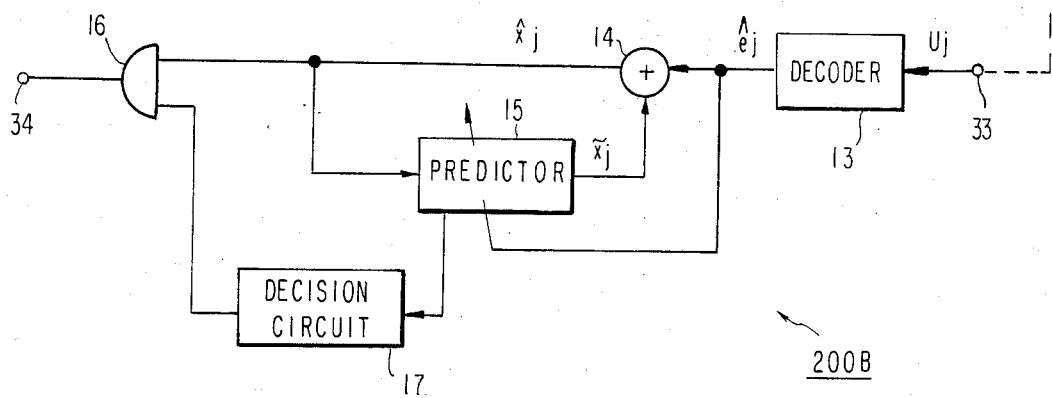

Referring to FIG. 3, a transmitter 200A and a receiver 200B for use in a second preferred embodiment are illustrated in block form. In this embodiment, the level detector 9 detects the level of the difference Y between the input signal $X_j$ and the output of the predictor 2, which is unlike the first embodiment of FIG. 1 where the corresponding circuit 9 detects the level of the difference Z between the input signal $X_j$ and the input to the predictor 2. Remaining structural elements of this second embodiment, which are identical with the respectively corresponding parts illustrated in FIG. 1, are not described here. This embodiment, like the first embodiment shown in FIG. 1, is capable of preventing the oscillation of the transmitter 200A from becoming unstable.

Figure 4:
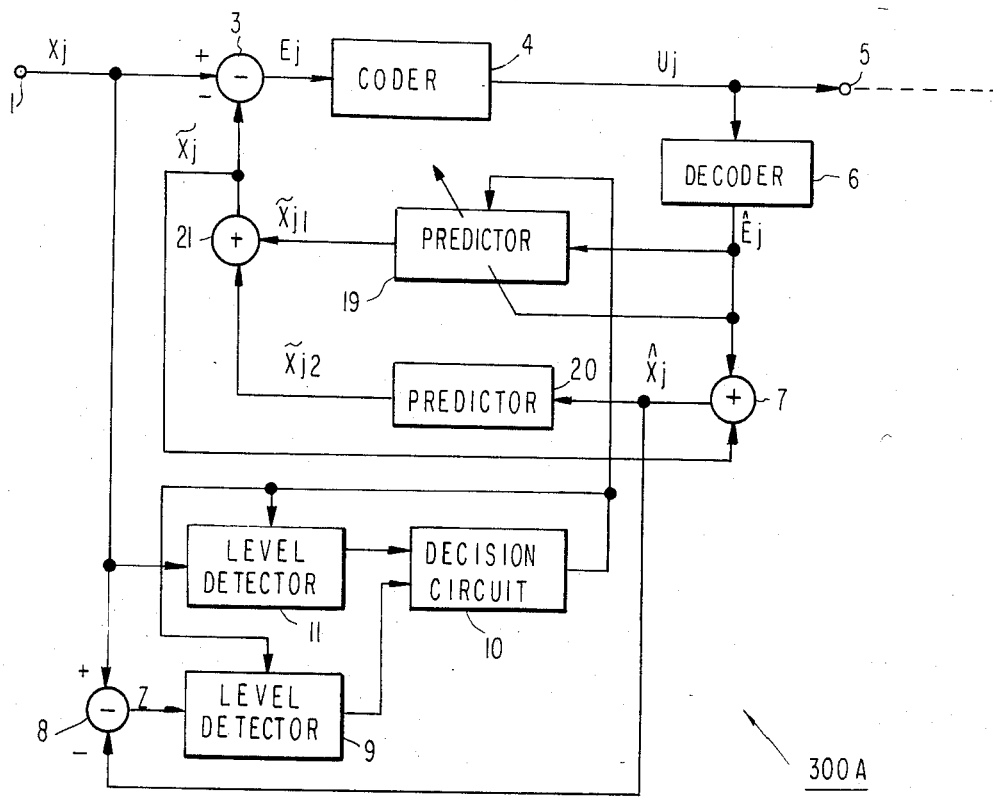
FIG. 4 is a block diagram of a transmitter and receiver constructed according to the teaching of a third embodiment of the invention.
Figure 4:
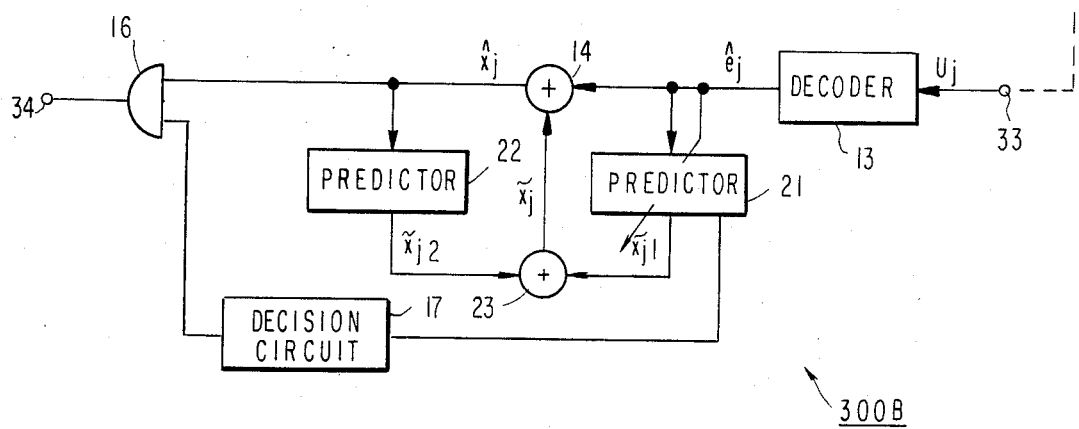

FIG. 4 is a block diagram illustrating a transmitter 300A and a receiver 300B for use in a third embodiment of the invention. The transmitter 300A has, instead of the single adaptive predictor 2 of the transmitter 100A shown in FIG. 1, two predictors which are an adaptive predictor 19 for generating a first predicted signal $\tilde{X}_{j1}$ according to a reproduced error signal $\hat{E}_j$ supplied by the decoder 6 and a fixed predictor 20 for generating a second predicted value $X_{j2}$ in response to the output $\hat{X}_j$ (locally decoded signal) of an adder 7. An adder 21 provides a predicted signal $\tilde{X}_j$ by adding the first predicted signal $\tilde{X}_{j1}$ and the second predicted signal $\tilde{X}_{j2}$.

Similarly, the receiver 300B has, instead of the predictor 15 of the receiver 100B shown in FIG. 1, two predictors which are an adaptive predictor 21 for generating a first predicted signal $\tilde{x}_{j1}$ in response to the reproduced error signal $\hat{e}_j$ given by the decoder 13 and a predictor 22 for generating a second predicted signal $\tilde{x}_{j2}$ in response to the output of the adder 14. The third embodiment too, like the first embodiment of FIG. 1, is able to prevent the receiver 300B from becoming unstable.

Figure 5:
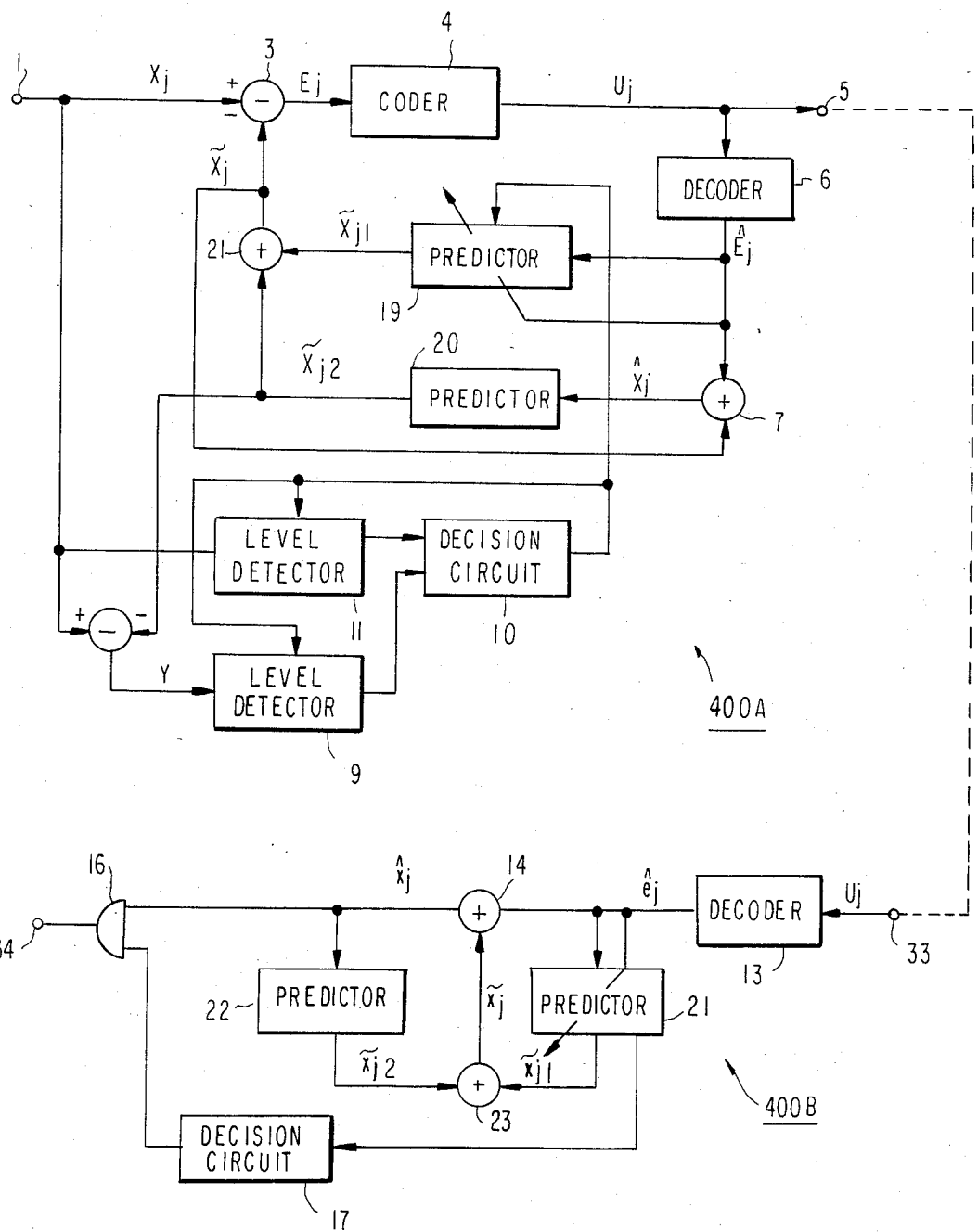
FIG. 5 is a block diagram of a transmitter and receiver constructed according to the teachings of a fourth embodiment of the invention.

A fourth embodiment of the invention illustrated in FIG. 5 has a transmitter 400A and a receiver 400B. The transmitter 300A shown in FIG. 4 differs from the transmitter 400A shown in FIG. 5 in that the input signal to the level detector 9 is the difference signal $Y=X_j-x_{j2}$. To describe the difference in more detail, while the level detector 9 of the transmitter 300A detects the level of the difference signal Z between the input signal $X_j$ and the input signal to the second predictor 20, the corresponding level detector 9 of the transmitter 400A shown in FIG. 5 detects the level of the difference signal Y between an input signal $X_j$ and the output of the second predictor 20.

Figure 6:
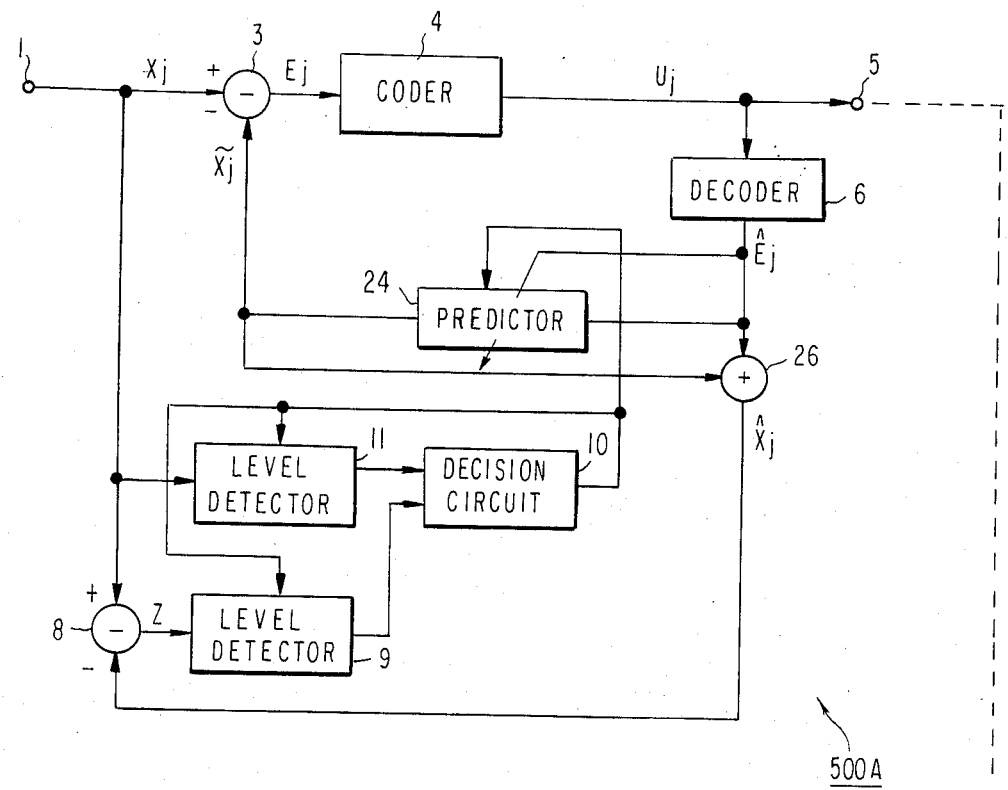
FIG. 6 is a block diagram of a transmitter and receiver according to a fifth embodiment of the invention.
Figure 6:
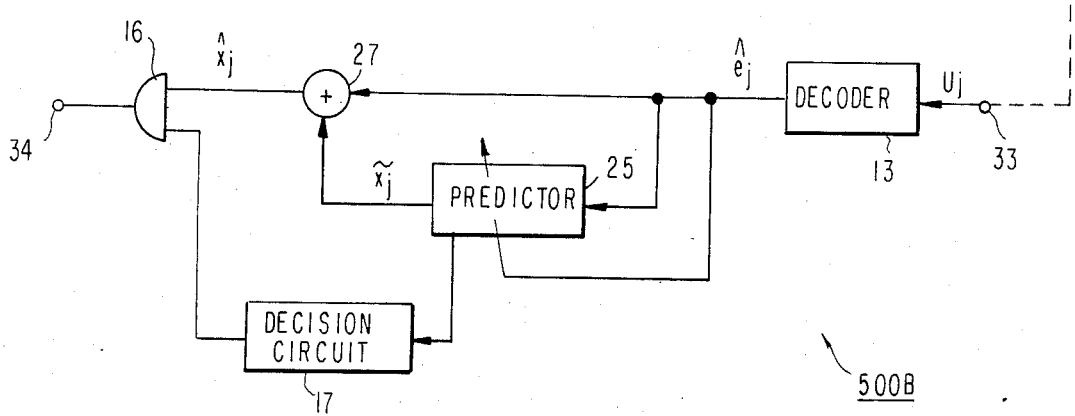

FIG. 6 is a block diagram illustrating a transmitter 500A and a receiver 500B for use in a fifth embodiment of the invention. The transmitter 500A of this embodiment differs from the transmitter 100A shown in FIG. 1 in the input received by the predictor. While the filter coefficients of a predictor 24 of the transmitter 500A is adjusted by the output $\hat{E}_j$ of the decoder 6, those of the predictor 2 of the transmitter 100A is corrected by the output signal $\hat{X}_j$ of the adder 7. Coefficient correction is accomplished using a version of either equation (1) or (2) in which $\hat{X}_{j-1}$ is replaced by $\hat{E}_j$.

Meanwhile in the receiver 500B, the filter coefficients of the predictor 25 are corrected by the reproduced error signal $\hat{e}_j$ from the decoder 13.

Figure 7:
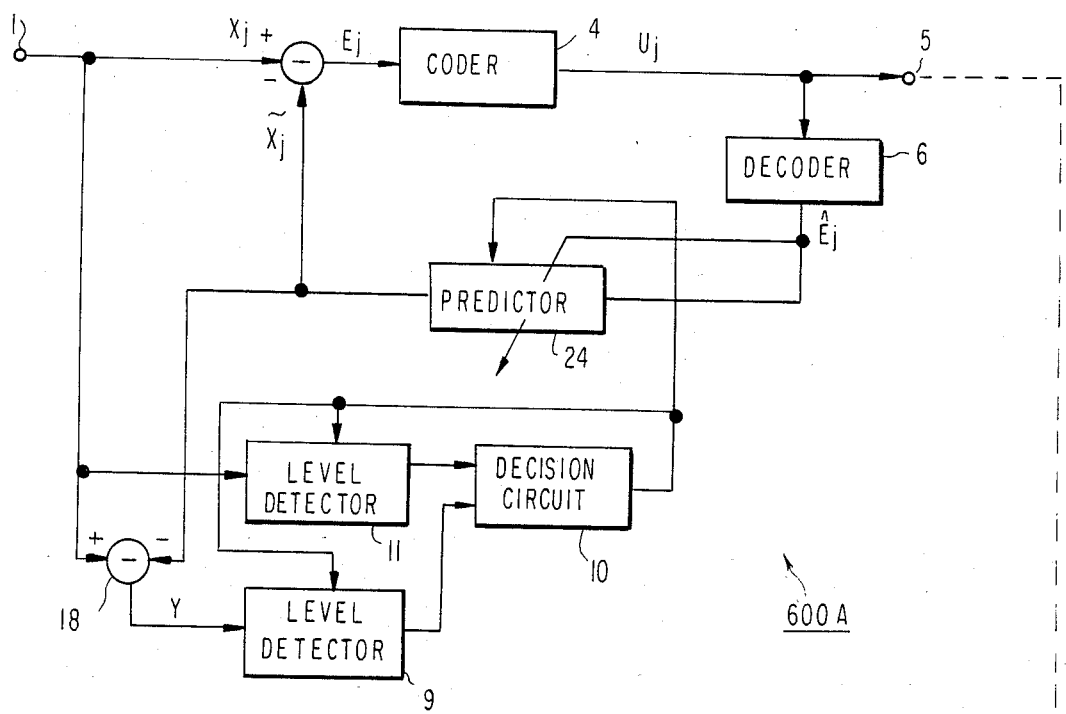
FIG. 7 is a block diagram of a transmitter and receiver built in accordance with the teachings of a sixth embodiment of the invention.
Figure 7:
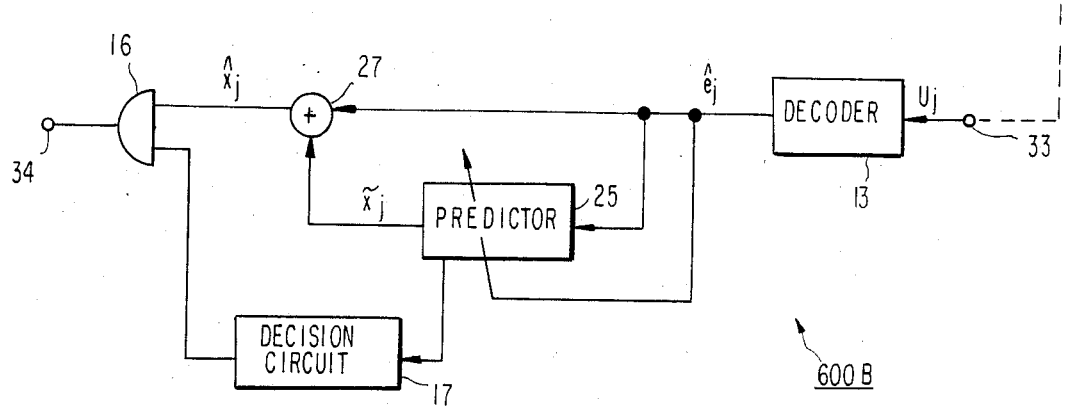

A sixth embodiment of the invention illustrated in FIG. 7 is a modification of the fifth embodiment shown in FIG. 6. In the sixth embodiment, the subtractor 8 of FIG. 6 is replaced by a subtractor 18 for providing the difference between the output $\tilde{X}_j$ of a predictor 24 and the input $X_j$.

Figure 8:
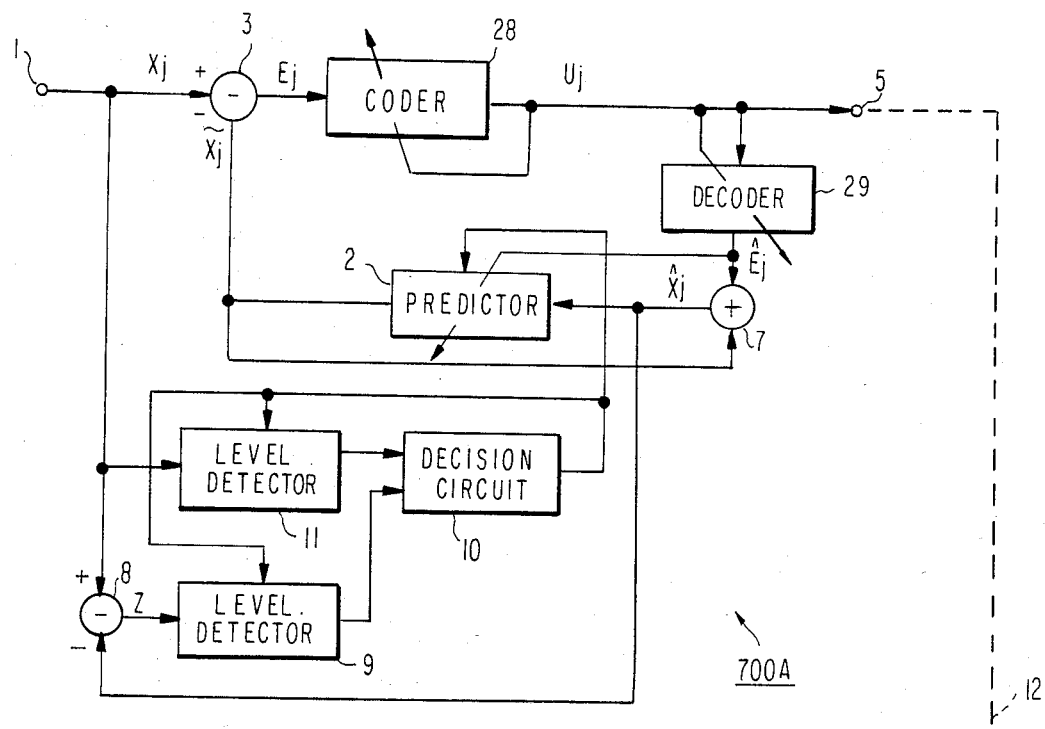
FIG. 8 is a block diagram of a transmitter and receiver built in accordance with the teachings of a seventh embodiment of the invention.
Figure 8:
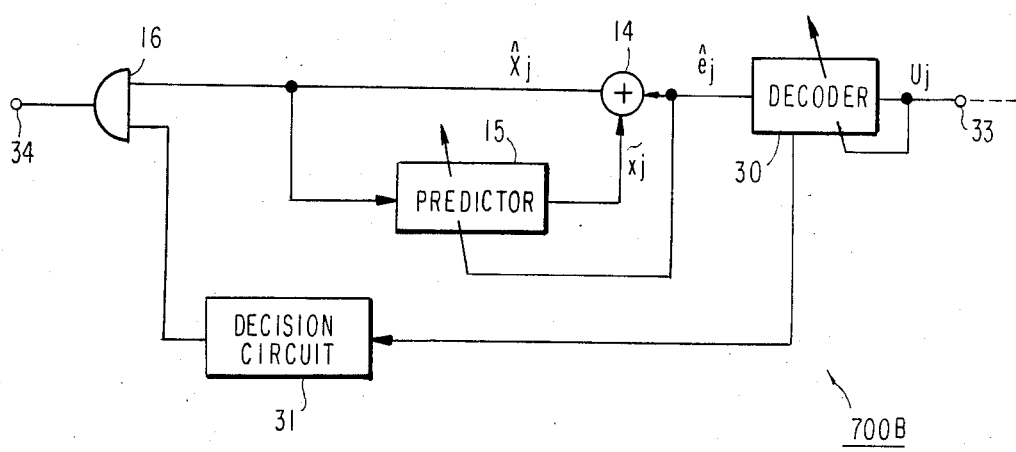

FIG. 8 is a block diagram illustrating a seventh embodiment of the present invention. A transmitter 700A of this embodiment is equipped with, instead of the coder 4 and the decoder 6 of the transmitter 100A of FIG. 1, a coder 28 and decoder 29 whose adaptation of quantizer step-size is performed on the basis of the code $U_j$. Similarly, the receiver 700B has, instead of the decoder 13 of the receiver 100B of FIG. 1, has a decoder 30, whose quantizer step-size can be adaptively varied with the code $U_j$ supplied from the transmitter 700A. For details on the adaptation of quantizer step-size, reference is made to P. Cummiskey, et al., "Adaptive Quantization of Differential PCM Coding of Speech" in The Bell System Technical Journal, Vol. 52, No. 7, pp. 1105–1118.

In the receiver 700B of the seventh embodiment, like in the receiver 100B shown in FIG. 1, the correction of the quantizer step-size becomes equal at every point of time when the code $U_j$ reaches all "0" or 37 1" owing to the instantaneous cut-off of the transmission line 12. As a result, the step-size takes an inconceivable value, and the receiver produces an abnormal sound. To obviate this trouble, the receiver 700B has a decision circuit 31 for determining whether or not the quantizer step-size of the decoder 30 is greater than a prescribed value. The decision circuit 31 may consist of a comparator.

As in the embodiment shown in FIG. 8, it is possible to apply the adaptation of the quantizer step-size to the coder 4 and the decoder 6 of any of the transmitters 200A to 600A of FIGS. 3 to 7, respectively. Similarly, the step-size adaptation may be applied to the decoder 13 of any of the receivers 200B to 600B. In this case, the decision circuit 17 of the receivers 200B and 600B is replaced by the decision circuit 31 of FIG. 8 which is capable of monitoring the quantizer step-size of the decoder 30.

As described above, the ADPCM system of the invention, by monitoring the level of the difference between the input signal and the predictor output or input signal of the transmitter, is able to make the transmitter free from instability. Further the ADPCM system of the invention, by monitoring the predictor or the decoder at the receiver, can prevent the receiver from producing any abnormal sound.

What is claimed is:

1. An ADPCM transmission system comprising:
   a transmitter having coding means including a subtractor for providing a difference $E_j$ between an input signal $X_j$ and a first predicted signal $\tilde{X}_j$, a coder for coding said difference $E_j$ given from said subtractor into a coded signal $U_j$, a first decoder for obtaining a first reproduced error signal $\hat{E}_j$ by decoding said coded signal $U_j$ given from said coder, and first prediction means for generating said first predicted signal $\tilde{X}_j$ on the basis of said first reproduced error signal $\hat{E}_j$ from said first decoder; means for producing a locally decoded signal $\hat{X}_j$ in response to said first reproduced error signal $\hat{E}_j$ and said first predicted signal $\tilde{X}_j$, and first control means for controlling said first prediction means in response to said input signal $X_j$ and a difference signal representing the difference between said input signal $X_j$ and said locally decoded signal $\hat{X}_j$; and
   a receiver having decoding means including a second decoder for receiving said code $U_j$ supplied from said transmitter and decoding said received code $U_j$ into a second reproduced error signal $\hat{e}_j$, second prediction means for producing a second predicted signal $\tilde{x}_j$ on the basis of said second reproduced error signal $\hat{e}_j$ from said second decoder, means for producing a decoded signal $\hat{x}_j$ in response to said second reproduced error signal $\hat{e}_j$ and said predicted signal $\tilde{x}_j$; and second control means for controlling said decoded signal $\hat{x}_j$ in response to a signal produced by said second prediction means.

2. A transmitter for use in an ADPCM transmission system comprising coding means including a subtractor for providing a difference $E_j$ between an input signal $X_j$ and a predicted signal $\bar{X}_j$, a coder for coding said difference $E_j$ given from said subtractor into a coded signal $U_j$, a decoder for obtaining a reproduced error signal $\hat{E}_j$ by decoding said coded signal $U_j$ given from said coder, and prediction means for generating said predicted signal $\bar{X}_j$ on the basis of said reproduced error signal $\hat{E}_j$ from said decoder; means for producing a locally decoded signal $\hat{X}_j$ in response to said reproduced error signal $\hat{E}_j$ and said predicted signal $\bar{X}_j$, said control means for controlling said prediction means in response to said input signal $X_j$ and a difference signal representing the difference between said input signal $X_j$ and said locally decoded signal $\hat{X}_j$.

3. A receiver for use in an ADPCM transmission system which includes a transmitter and a receiver, said receiver comprising; decoding means including a decoder for receiving a code $U_j$ supplied from said transmitter and decoding said received code $U_j$ into a reproduced error signal $\hat{e}_j$, prediction means for producing a predicted signal $\bar{x}_j$ on the basis of said reproduced error signal $\hat{e}_j$, means for producing a decoded signal $x_j$ in response to said reproduced error signal $e_j$ and said predicted signal $\bar{x}_j$, and control means for controlling said decoded signal $\hat{x}_j$ in response to a signal produced by said prediction means.

4. In an ADPCM transmission system, a method for transmitting and receiving ADPCM signals, said method for transmitting including the steps of:
providing a difference signal $E_j$ between an input signal $X_j$ and a first predicted signal $\bar{X}_j$, coding said difference signal $E_j$ into a coded signal $U_j$, decoding said coded signal $U_j$ into a first reproduced error signal $\hat{E}_j$, producing said first predicted signal $\bar{X}_j$ on the basis of said first reproduced error signal $\hat{E}_j$, producing a locally decoded signal $\hat{X}_j$ in response to said first reproduced error signal $\hat{E}_j$ and said first predicted signal $\bar{X}_j$, producing a first control signal from said input signal and a difference signal representing the difference between said input signal and said locally decoded signal $\hat{X}_j$, and controlling said first predicted signal $\bar{X}_j$ according to said first control signal and transmitting said code $U_j$; and said method for receiving including the steps of receiving said transmitted code $U_j$, decoding said code $U_j$ into a second reproduced error signal $\hat{e}_j$, producing a second predicted signal $\bar{x}_j$ on the basis of said second reproduced error signal $\hat{e}_j$, producing a decoded signal $\hat{x}_j$ from said second predicted signal $\bar{x}_j$ and said second reproduced error signal $\hat{e}_j$, producing a second control signal in response to a signal produced on the basis of said second reproduced error signal $\hat{e}_j$ for controlling the decoded signal $\hat{x}_j$ according to said second control signal.

5. In an ADPCM system, a method for transmitting ADPCM signals comprising the steps of:
providing a difference signal $E_j$ between an input signal $X_j$ and a predicted signal $\bar{X}_j$, coding said difference $E_j$ into a coded signal $U_j$, decoding said coded signal $U_j$ into a reproduced error signal $\hat{E}_j$, producing said predicted signal $\bar{X}_j$ on the basis of said reproduced error signal $\hat{E}_j$, producing a locally decoded signal $\hat{X}_j$ in response to said reproduced error signal $\hat{E}_j$ and said predicted signal $\bar{X}_j$, producing a control signal from said input signal and a difference signal representing the difference between said input signal and said locally decoded signal $\hat{X}_j$, and controlling said predicted signal $\bar{X}_j$ according to said control signal.

6. In an ADPCM system, a method for receiving ADPCM signals including a coded signal $U_j$ transmitted by an ADPCM transmitter comprising the steps of:
receiving said transmitted code $U_j$, decoding said code $U_j$ into a reproduced error signal $e_j$, producing a predicted signal $x_j$ on the basis of said reproduced error signal $e_j$, producing a decoded signal $x_j$ from said predicted signal $x_j$ and said reproduced error signal $e_j$ producing a control signal in response to a signal produced on the basis of said reproduced error signal $e_j$ for controlling the decoded signal $x_j$ according to said control signal.

7. In the ADPCM transmission system of claim 1 wherein said first means for controlling said first prediction means comprises a first level detector, the input to which is connected to said input signal, a subtraction circuit receiving said input signal and said locally decoded signal, a second level detector receiving the output from said subtraction circuit, and a decision circuit the inputs to which are the outputs of said first and second level detectors and the output of which is connected to said prediction means.

8. In the ADPCM transmission system of claim 1 wherein said first prediction means comprises a first adaptive predictor receiving said first reproduced error signal $\hat{E}_j$ and a first fixed predictor receiving the locally decoded signal $\hat{X}_j$ representing the sum of said first reproduced error signal $E_j$ and the first predicted signal $\bar{X}_j$, and wherein said second prediction means comprises a second adaptive predictor receiving said second reproduced error signal $\hat{e}_j$ and a second fixed predictor receiving said decoder signal $\hat{x}_j$.

9. An ADPCM transmission system comprising:
a transmitter having coding means including a subtractor for providing a difference $E_j$ between an input signal $X_j$ and a first predicted signal $\bar{X}_j$, a coder for coding said difference $E_j$ given from said subtractor into a coded signal $U_j$, a first decoder for obtaining a first reproduced error signal $\hat{E}_j$ by decoding said coding signal $U_j$ given from said coder, first prediction means for generating said first predicted signal $\bar{X}_j$ on the basis of said first reproduced error signal $\hat{E}_j$ from said first decoder, means for producing a locally decoded signal $\hat{X}_j$ in response to said first reproduced error signal $\hat{E}_j$ and said first predicted signal $\bar{X}_j$, and first control means for controlling said first prediction means in response to said input signal $X_j$ and a difference signal representing the difference between said input signal $X_j$ and said first predicted signal $\bar{X}_j$; and a receiver having decoding means including a second decoder for receiving said coded signal $U_j$ supplied from said transmitter and decoding said received coded signal $U_j$ into a second reproduced error signal $\hat{e}_j$, second prediction means for producing a second predicted signal $\bar{x}_j$ on the basis of said second reproduced error signal $\hat{e}_j$ from said second decoder, means for producing a decoded signal $\hat{x}_j$ in response to said second reproduced error signal $\hat{e}_j$ and said second predicted signal $\bar{x}_j$, and second control means for controlling said decoded signal $\hat{x}_j$ in response to a signal produced by said second prediction means.

10. In the ADPCM transmission system of claim 9 wherein said first means for controlling said first prediction means comprises a first level detector, the input to which is connected to receive said input signal, a subtraction circuit receiving said input signal and said first predicted signal, a second level detector receiving the output from said subtraction circuit, and a decision circuit the inputs to which are the outputs of said first and second level detectors and the output of which is connected to said prediction means.

11. In the ADPCM transmission system of claim 9 wherein said first prediction means comprises a first adaptive predictor receiving said first reproduced error signal $\hat{E}_j$ and a first fixed predictor receiving a locally produced input signal $\hat{X}_j$ representing the sum of said first reproduced error signal $E_j$ and the first predicted signal $\widetilde{X}_j$, and wherein said second prediction means comprises a second adaptive predictor receiving said second reproduced error signal $\hat{e}_j$ and a second fixed predictor receiving said decoded signal $\hat{x}_j$.

12. A transmitter for use in an ADPCM transmission system comprising coding means including a subtractor for providing a difference $E_j$ between an input signal $X_j$ and a predicted signal $\widetilde{X}_j$, a coder for coding said difference $E_j$ given from said subtractor into a coded signal $U_j$, a decoder for obtaining a reproduced error signal $\hat{E}_j$ by decoding said coded signal $U_j$ given from said coder, prediction means for generating said predicted signal $\widetilde{X}_j$ on the basis of said reproduced error signal $\hat{E}_j$ from said decoder, means for producing a locally decoded signal $\hat{X}_j$ in response to said reproduced error signal $\hat{E}_j$ and said predicted signal $\widetilde{X}_j$, and control means for controlling said prediction means in response to said input signal $X_j$ and a difference signal representing the difference between said input signal $X_j$ and said predicted signal $\widetilde{X}_j$.

13. In an ADPCM transmission system, a method for transmitting and receiving ADPCM signals, said method for transmitting including the steps of:
providing a difference signal $E_j$ between an input signal $X_j$ and a first predicted signal $\widetilde{X}_j$, coding said difference signal $E_j$ into a coded signal $\hat{U}_j$, decoding said coded signal $U_j$ into a first reproduced error signal $\hat{E}_j$, producing said first predicted signal $\widetilde{X}_j$ on the basis of said first reproduced error signal $E_j$, producing a locally decoded signal $\hat{X}_j$ in response to said first reproduced error signal $\hat{E}_j$ and said first predicted signal $\widetilde{X}_j$, producing a first control signal from said input signal and a difference signal representing the difference between said input signal and said first predicted signal $\widetilde{X}_j$, and controlling said first predicted signal $\widetilde{X}_j$ according to said first control signal and transmitting said coded signal $U_j$; and said method for receiving including the steps of receiving said transmitted code $U_j$, decoding said code $U_j$ into a second reproduced error signal $\hat{e}_j$, producing a second predicted signal $\widetilde{x}_j$ on the basis of said reproduced error signal $\hat{e}_j$, producing a decoded signal $\hat{x}_j$ from said second predicted signal $\widetilde{x}_j$ and said second reproduced error signal $\hat{e}_j$, and producing a second control signal in response to a signal produced on the basis of said second reproduced error signal $\hat{e}_j$ for controlling the decoded signal $\hat{x}_j$ according to said second control signal.

14. In an ADPCM system, a method for transmitting ADPCM signals comprising the steps of:
providing a difference signal $E_j$ between an input signal $\widetilde{X}_j$ and a predicted signal $X_j$, coding said difference $\hat{E}_j$ into a coded signal $U_j$, decoding said coded signal $U_j$ into a reproduced error signal $\hat{E}_j$, producing said predicted signal $\widetilde{X}_j$ on the basis of said reproduced error signal $\hat{E}_j$, producing a locally decoded signal $\hat{X}_j$ in response to said reproduced error signal $\hat{E}_j$ and said predicted signal $\widetilde{X}_j$, producing a control signal from said input signal and a difference signal representing the difference between said input signal and said predicted signal $\widetilde{X}_j$, and controlling said predicted signal $\widetilde{X}_j$ according to said control signal.

* * * * *

UNITED STATES PATENT AND TRADEMARK OFFICE
CERTIFICATE OF CORRECTION

PATENT NO. : 4,554,670                      Page 1 of 2

DATED : November 19, 1985

INVENTOR(S) : Shinichi Aiko; Rikio Maruta; Takao Nishitani

It is certified that error appears in the above-identified patent and that said Letters Patent is hereby corrected as shown below:

Abstract, Line 4, "$X_j$" (second occurrence) should read --$\tilde{X}_j$--

Line 7, "$E_j$" should read --$E_{\tilde{j}}$--

Line 9, "$X_j$" should read --$X_{\hat{j}}$--

Line 9, "$E_{\hat{j}}$" should read --$E_j$--

Column 1, Line 51, "$E_j$" should read --$E_{\hat{j}}$--

Column 3, (Formula 1), "$(x_{j-i})^2$" should read --$(\hat{x}_{j-i})^2$--

Column 3, Line 45, "$x_j$" should read --$x_{\tilde{j}}$--

Column 5, Line 11, "$x_{j2}$ should read --$x_{\hat{j}2}$--

Column 6, Line 8, delete "37" and insert --"--

Line 41, "$E_{\tilde{j}}$" should read --$E_{\hat{j}}$--

Column 7, Line 8, "$x_j$" should read --$x_{\hat{j}}$--

Line 21, "$x_j$" should read --$x_{\hat{j}}$--

Line 22, "$e_{\tilde{j}}$" should read --$e_{\hat{j}}$--

Line 23, "$x_j$" should read --$x_{\hat{j}}$--

Line 49, "$x_j$" should read --$x_{\hat{j}}$--

Column 8, Line 5, "$e_j$" should read --$e_{\tilde{j}}$--

Line 6, "$x_j$" should read --$x_{\hat{j}}$--

Line 7, "$e_j$" should read --$e_{\hat{j}}$--

Line 8, "$x_j$" should read --$x_{\tilde{j}}$-- (first occurrence)

Line 8, "$x_j$" should read --$\hat{x}_j$-- (second occurrence)

Line 9, "$e_j$" should read --$e_j$--

UNITED STATES PATENT AND TRADEMARK OFFICE
CERTIFICATE OF CORRECTION

PATENT NO. : 4,554,670  
DATED : November 19, 1985  
INVENTOR(S) : Shinichi Aiko; Rikio Maruta; Takao Nishitani Page 2 of 2

It is certified that error appears in the above-identified patent and that said Letters Patent is hereby corrected as shown below:

|  |  |  |
|---|---|---|
| | Line 11, "$e_j$" should read $--\hat{e}_j--$ |
| | Line 12, "$x_j$" should read $--\hat{x}_j--$ |
| | Line 28, "$\hat{E}_j$" should read $--E_j--$ |
| Column 9, | Line 37, "$U_j$" should read $--\hat{U}_j--$ |
| | Line 38, "$U_j$" should read $--\hat{U}_j--$ |
| Column 10, | Line 2, "$\tilde{E}_j$" should read $--\hat{E}_j--$ |
| | Line 15, "$\tilde{x}_j$" should read $--x_j--$ |
| | Line 26, "$\hat{X}_j$" should read $--X_j--$ and "$X_j$" should read $--\hat{X}_j--$ |
| | Line 27, "$\hat{E}_j$" should read $--E_j--$ |

Signed and Sealed this

Second Day of September 1986

[SEAL]

Attest:

DONALD J. QUIGG

Attesting Officer

Commissioner of Patents and Trademarks